United States Patent
Fifield et al.

(10) Patent No.: US 9,654,086 B1
(45) Date of Patent: May 16, 2017

(54) OPERATIONAL AMPLIFIER WITH CURRENT-CONTROLLED UP OR DOWN HYSTERESIS

(71) Applicant: GLOBALFOUNDRIES INC., Grand Cayman (KY)

(72) Inventors: John A. Fifield, Underhill, VT (US); Eric D. Hunt-Schroeder, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/992,426

(22) Filed: Jan. 11, 2016

(51) Int. Cl.
- *H03K 3/02* (2006.01)
- *H03K 3/0233* (2006.01)
- *H03K 5/24* (2006.01)

(52) U.S. Cl.
CPC ....... *H03K 3/02337* (2013.01); *H03K 5/2481* (2013.01)

(58) Field of Classification Search
CPC .......................... H03K 3/0233; H03K 3/02337
See application file for complete search history.

(56) References Cited

U.S. PATENT DOCUMENTS

| | | | |
|---|---|---|---|
| 4,874,969 A | 10/1989 | Meadows | |
| 5,446,396 A | 8/1995 | Brehmer | |
| 5,712,204 A | 1/1998 | Horiuchi | |
| 5,715,204 A * | 2/1998 | Barcella | G11C 7/062 365/207 |
| 6,118,318 A | 9/2000 | Fifield et al. | |
| 6,281,731 B1 | 8/2001 | Fifield et al. | |
| 6,288,575 B1 | 9/2001 | Forbes | |
| 6,504,405 B1 | 1/2003 | Nguyen et al. | |
| 6,870,413 B1 * | 3/2005 | Chang | H03K 3/3565 327/205 |
| 7,167,032 B1 * | 1/2007 | Barlow | H03K 3/3565 327/205 |
| 7,714,620 B1 * | 5/2010 | Xu | H03K 5/2481 327/63 |
| 8,159,301 B1 | 4/2012 | Duffy et al. | |
| 8,736,333 B1 * | 5/2014 | Tercariol | H03K 3/3565 327/205 |

* cited by examiner

*Primary Examiner* — Jeffrey Zweizig
(74) *Attorney, Agent, or Firm* — Gibb & Riley, LLC; Anthony J. Canale (57) ABSTRACT

Disclosed is an op-amp circuit with current-controlled hysteresis that is insensitive to PVT variations. In the circuit, a digital output signal is output from an output buffer based on the output voltage at an output node of an op-amp. A current source is connected to the input side of the op-amp or one of multiple current sources is selectively connected to the input side and enabled when the digital output signal has a high value to provide falling edge hysteresis. Alternatively, a current source is connected to the reference side of the op-amp or one of multiple current sources is selectively connected to the reference side and enabled when the digital output signal is low to provide rising edge hysteresis. Alternatively, current sources are connected to both the input and reference sides and selectively controlled to provide either falling or rising edge hysteresis.

20 Claims, 8 Drawing Sheets

OPERATIONAL AMPLIFIER WITH CURRENT-CONTROLLED UP OR DOWN HYSTERESIS

FIELD OF THE INVENTION

The present invention relates to operational amplifiers (op-amps) and, more specifically to, differential op-amp circuits with hysteresis.

BACKGROUND

A differential operational amplifier (op-amp), which is often referred to as a differential amplifier or an op-amp voltage comparator, is a high-gain electronic voltage amplifier that receives an input voltage and a reference voltage and outputs an output voltage that is typically many times larger than the difference between the input voltage and the output voltage. The output voltage can be processed by an output buffer that converts the output voltage into a digital output signal indicative of whether or not the input voltage is above or below the reference voltage. For example, a digital output signal with a high value (i.e., a "1" value) can indicate that the input voltage is above the reference voltage and a digital output signal with a low value (i.e., a "0" value) can indicate that the input voltage is below the reference voltage. Thus, the digital output signal changes with the difference between the input voltage and output voltage crosses through 0V. Current state of the art op-amps can respond to voltage differences between the input voltage and reference voltage of only a few millivolts (mV). As a result, these op-amps are susceptible to noise glitches. Specifically, small fluctuations due to noise can cause the digital output signal to repeatedly swing from low to high and vice versa (i.e., to chatter). This chatter can propagate into logic circuits that are down stream of the op-amp and can, thus, cause errors. Additionally, this chatter can cause an increase in power consumption.

Consequently, hysteresis is often added to the op-amp circuitry in an attempt to prevent unwanted switching of the digital output signal due to noise. For example, instead of allowing switching to occur whenever the voltage difference passes through 0V, rising and/or falling voltage trip points are used. With a rising voltage trip point, the digital output signal will only switch to high, when the input voltage is some number of millivolts above the reference voltage. With a falling voltage trip point the digital output signal will only switch to low, when the input voltage is some number of millivolts below the reference voltage. Unfortunately, op-amp configurations that enable the use of rising and/or falling voltage trip points are often sensitive to power-voltage-temperature (PVT) variations, which make the trip point(s) unpredictable.

SUMMARY

Disclosed herein is a differential operational amplifier (op-amp) circuit with current-controlled falling edge hysteresis. The circuit can incorporate an op-amp. The op-amp can have an input voltage side with a pair of stacked first transistors and a reference voltage side with a pair of stacked second transistors. The op-amp can further have at least one third transistor, wherein the pair of stacked first transistors and the pair of stacked second transistors are each connected to the third transistor. The op-amp can further have an output node located at an end of the pair of stacked second transistors and a trip point adjustment node located at an interface between the stacked first transistors (i.e., on the input voltage side of the op-amp). The circuit can further have a current source and an output buffer. The current source can be electrically connected to the trip point adjustment node. The output buffer can be electrically connected between the output node and to the current source. The output buffer can output a digital output signal based on an output voltage at the output node and, based on the value of the digital output signal, the current source can be selectively disabled or selectively enabled. Specifically, the current source can be selectively disabled when the digital output signal has a first value (e.g., a low value, a "0" value). The current source can further be selectively enabled to adjust and, particularly, to pull down a voltage level at the trip point adjustment node by a predetermined amount when the digital output signal has a second value (e.g., a high value, a "1" value), thereby ensuring that the digital output signal will only be switched to the first value when the input voltage has dropped below the reference voltage by the predetermined amount. Optionally, instead of being connected directly to a single current source, the trip point adjustment node can be connected to a multiplexer, which is, in turn, connected to a set of different current sources. In this case, the multiplexer can receive a select signal and, based on the select signal, can selectively connect a specific current source to the trip point adjustment node so as to allow the voltage level at the trip point adjustment node to be adjusted by a selected predetermined amount when the digital output signal has the second value.

Also disclosed herein is a differential operational amplifier (op-amp) circuit with current-controlled rising edge hysteresis. The circuit can incorporate an op-amp. The op-amp can have an input voltage side with a pair of stacked first transistors and a reference voltage side with a pair of stacked second transistors. The op-amp can further have at least one third transistor, wherein the pair of stacked first transistors and the pair of stacked second transistors are connected to the third transistor. The op-amp can further have output node located at an end of the pair of stacked second transistors and a trip point adjustment node located at an interface between the stacked second transistors (i.e., on the reference voltage side of the op-amp). The circuit can further incorporate a current source, an inverter and an output buffer. The current source can be electrically connected to the trip point adjustment node. The output buffer can be electrically connected to the output node and can further be electrically connected to the current source through the inverter. The output buffer can output a digital output signal based on an output voltage at the output node and, based on the value of the digital output signal, the current source can be selectively enabled or selectively disabled. Specifically, the current source can be selectively enabled to adjust and, particularly, to pull down the voltage level at the trip point adjustment node by a predetermined amount when the digital output signal has a first value (e.g., a low value, a "0" value), thereby ensuring that the digital output signal will only be switched back to a second value (e.g., a high value, a "1" value) when the input voltage has risen above the reference voltage by the predetermined amount. The current source can further be selectively disabled when the digital output signal has the second value. Optionally, instead of being connected directly to a single current source, the trip point adjustment node can be connected to a multiplexer, which is, in turn, connected to a set of different current sources. In this case, the multiplexer can receive a select signal and, based on the select signal, can selectively connect a specific current source to the trip point adjustment node so as to allow the voltage level at the trip point adjustment node to be adjusted by a selected predetermined amount when the digital output signal has the first value.

Also disclosed herein is a differential operational amplifier (op-amp) circuit with selectable current-controlled falling edge hysteresis and current-controlled rising edge hysteresis. The circuit incorporates an op-amp. The op-amp has an input voltage side with a pair of stacked first transistors and a reference voltage side with a pair of stacked second transistors. The op-amp further has at least one third transistor, wherein the pair of stacked first transistors and the pair of stacked second transistors are connected to the third transistor. An output node can be located at an end of the pair of stacked second transistors. A first trip point adjustment node can be located at a first interface between the stacked first transistors (i.e., on the input voltage side of the op-amp). A second trip point adjustment node can be located at a second interface between the stacked second transistors (i.e., on the reference voltage side of the op-amp). In this case, the circuit can further have a first current source, a second current source, a multiplexer, an inverter and an output buffer. The first current source can be electrically connected to the first trip point adjustment node. The second current source can be electrically connected to the second trip point adjustment node. The output buffer can be electrically connected to the output node and to the multiplexer. The multiplexer can have a first output electrically connected to the first current source. The multiplexer can further have a second output electrically connected to the second current source through the inverter. The output buffer can output a digital output signal based on an output voltage at the output node and the multiplexer can be selectively controllable (e.g., based on a select signal) so that the digital output signal is selectively output to either the first current source in order to selectively provide falling edge hysteresis or to the inverter and, once inverted, to the second current source to provide rising edge hysteresis.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, a differential operational amplifier (op-amp), which is often referred to as a differential amplifier or an op-amp voltage comparator, is a high-gain electronic voltage amplifier that receives an input voltage and a reference voltage and outputs an output voltage that is typically many times larger than the difference between the input voltage and the output voltage. The output voltage can be processed by an output buffer that converts the output voltage into a digital output signal indicative of whether or not the input voltage is above or below the reference voltage. For example, a digital output signal with a high value (i.e., a "1" value) can indicate that the input voltage is above the reference voltage and a digital output signal with a low value (i.e., a "0" value) can indicate that the input voltage is below the reference voltage. Thus, the digital output signal changes with the difference between the input voltage and output voltage crosses through 0V. Current state of the art op-amps can respond to voltage differences between the input voltage and reference voltage of only a few millivolts (mV). As a result, these op-amps are susceptible to noise glitches. Specifically, small fluctuations due to noise can cause the digital output signal to repeatedly swing from low to high and vice versa (i.e., to chatter). This chatter can propagate into logic circuits that are down stream of the op-amp and can, thus, cause errors. Additionally, this chatter can cause an increase in power consumption.

In an attempt to prevent unwanted switching of the digital output signal due to noise, op-amp circuitry with hysteresis has been previously developed. In this case, instead of allowing switching to occur whenever the voltage difference passes through 0V, rising and/or falling voltage trip points are used. With a rising voltage trip point, the digital output signal will only switch to high, when the input voltage is some number of millivolts above the reference voltage. With a falling voltage trip point the digital output signal will only switch to low, when the input voltage is some number of millivolts below the reference voltage. Unfortunately, op-amp configurations that enable the use of rising and/or falling voltage trip points are often sensitive to power-voltage-temperature (PVT) variations that make the trip point(s) unpredictable.

Figure 1:
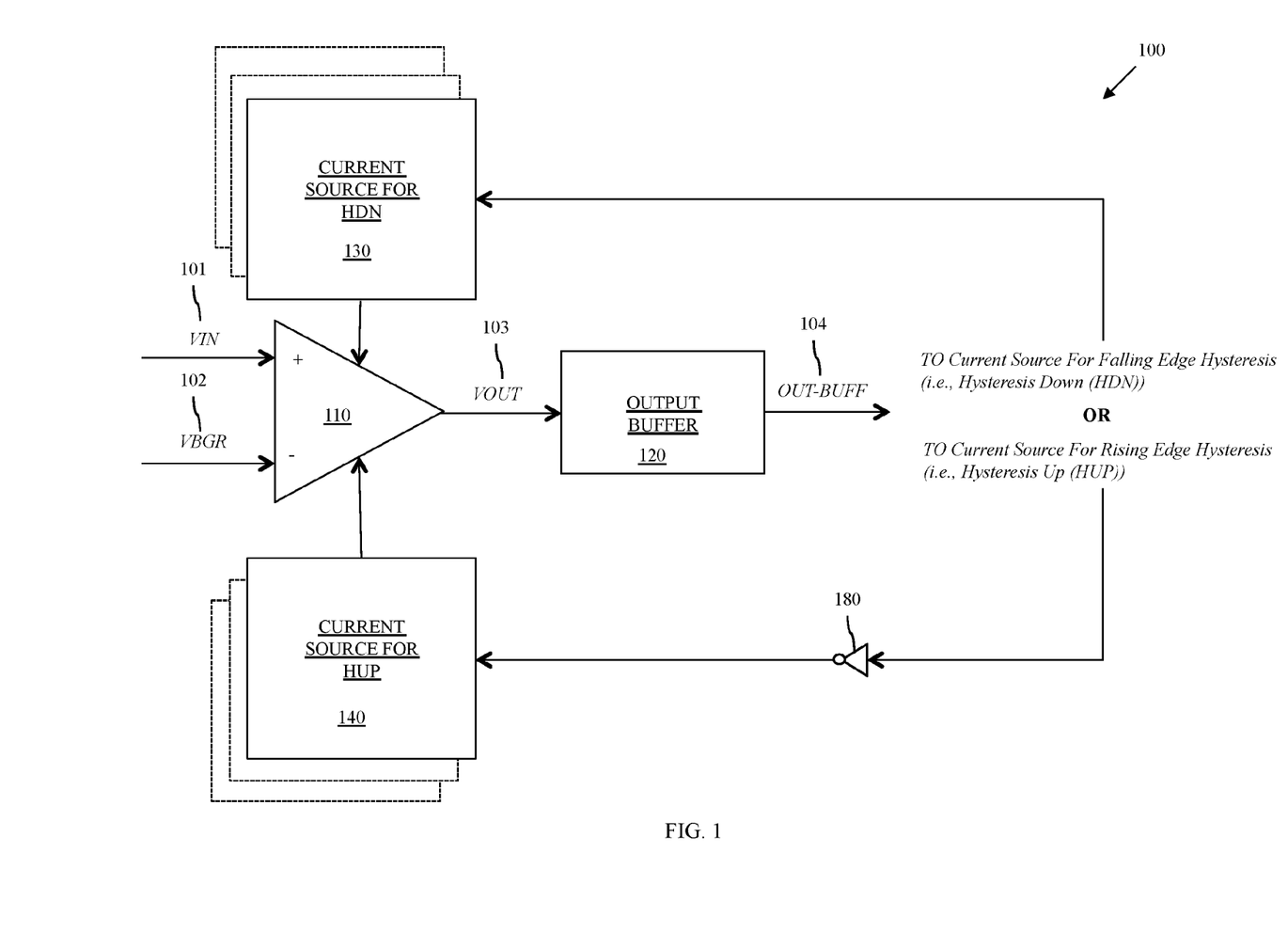
FIG. 1 is a schematic diagram generally illustrating the differential operational amplifier (op-amp) circuit disclosed herein, which provides current-controlled hysteresis.

In view of the foregoing, disclosed herein are various embodiments of a differential operational amplifier (op-amp) circuit 100, as shown in FIG. 1, with current-controlled hysteresis that is insensitive to PVT variations. Generally, each of the embodiments disclosed herein can incorporate an operational amplifier (op-amp) 110 and an output buffer 120. The op-amp 110 can have a pair of input nodes and an output node. The op-amp 110 can process an input voltage 101 (VIN) and a reference voltage 102 (VBGR) applied to the input nodes and an output voltage 103 at the output node can indicate whether or not the input voltage 101 is higher or lower than the reference voltage 102. The output buffer 120 can be electrically connected to the output node. The output buffer 120 can output a digital output signal 104 (OUT_

BUFF) based on the output voltage 103. Like the output voltage 103, this digital output signal 104 can indicate whether the input voltage 101 is higher or lower than the reference voltage 102. For example, a digital output signal 104 with a first value (e.g., a low value, a "0" value) can indicate that the input voltage 101 is lower than the reference voltage 102 and a digital output signal 104 with a second value (e.g., a high value, a "1" value) can indicate that the input voltage 101 has risen above the reference voltage 102. The circuit 100 can further have at least one first current source 130 for providing falling edge hysteresis (also referred to herein as hysteresis down (HDN)) and/or at least one second current source 140 for providing rising edge hysteresis (also referred to herein as hysteresis up (HUP)) based on the value of the digital output signal 104.

For example, a first current source 130 can be connected to the output buffer 120 and connected to the input voltage side of the op-amp 110 to provide a predetermined amount of falling edge hysteresis. Alternatively, multiple first current sources 130 can be connected to the output buffer 120 and one of these first current sources can be selectively connected (e.g., through a multiplexer, not shown) to the input voltage side of an op-amp 110 to provide a selected predetermined amount of falling edge hysteresis. Alternatively, a second current source 140 can be connected to the output buffer 120 by an inverter 180 and further connected to the reference voltage side of the op-amp 110 to provide a predetermined amount of rising edge hysteresis. Alternatively, multiple second current sources 140 can be connected to the output buffer 120 by inverter(s) and one of these second current sources can be selectively connected (e.g., through a multiplexer, not shown) to the reference voltage side of the op-amp 110 to provide a selected predetermined amount of rising edge hysteresis. Alternatively, first current source(s) 130 can be connected to the input voltage side of the op-amp 110 and second current source(s) 140 can be connected to the reference voltage side of the op-amp 110. In this case, a multiplexer (not shown) can redirect the digital output signal of the output buffer either to the first current source(s) 130 or through inverter(s) to the second current source(s) 140 to provide for either falling edge hysteresis or rising edge hysteresis, on demand.

More particularly, referring to FIGS. 2A-2E disclosed herein are various embodiments 200A-200E of a differential operational amplifier (op-amp) circuit. Each of the embodiments, 200A-200E of the op-amp circuit can incorporate an op-amp 210.

The op-amp 210 can have a differential input stage 260. The differential input stage 260 can have an input voltage side with two first transistors 261a-261b connected in series at node 213 (i.e., a pair of stacked first transistors) and a reference voltage side with two second transistors 262a-262b connected in series at node 214 (i.e., a pair of stacked second transistors 262a-262b). Additionally, the pair of stacked first transistors 261a-261b and the pair of stacked second transistors 262a-262b can each be connected to at least one third transistor (e.g., a pair of stacked third transistors 263a-263b) at the same node 215. The first transistors 261a-261b, the second transistors 262a-262b and the third transistors 263a-263b can all have the same type conductivity. The third transistor(s) 263a-263b can be connected in series between the node 215 and a first voltage rail. In this differential input stage 260, the gates of the first transistors 261a-261b can be coupled to an input voltage 201, the gates of the second transistors 262a-262b can be coupled to a first reference voltage 202 and the gates of the third transistor(s) 263a-263b can be coupled to a second reference voltage 205.

The input voltage 201 can be any voltage from any circuit requiring monitoring. For example, an exemplary system that may incorporate the disclosed differential op-amp circuit may compare a supply voltage through a resistor ladder to reference voltage in order to set digital flags as the supply voltage varies from the minimum voltage (Vmin) (e.g., of 650 mV) to the maximum voltage (Vmax) (e.g., of 1V).

The first reference voltage 202 can be, for example, a bandgap reference voltage (VBGR). Those skilled in the art will recognize that a bandgap reference voltage (VBGR) is a process-voltage-temperature (PVT)-independent reference voltage provided by an on-chip bandgap reference voltage circuit 290. That is, it is a reference voltage that is provided by an on-chip bandgap reference voltage circuit 290 such that it is essentially constant regardless of PVT variations. The bandgap reference voltage (VBGR) used in the differential op-amp circuit disclosed herein can be pre-selected based on the application (e.g., the voltage ranges, etc.) and also on the type of transistors used (e.g., threshold voltage type, oxide thickness type, etc.). For example, in the exemplary system discussed above that used the disclosed differential op-amp circuit to compare a supply voltage through a resistor ladder to reference voltage in order to set digital flags as the supply voltage varies from the minimum voltage (Vmin) (e.g., of 650 mV) to the maximum voltage (Vmax) (e.g., of 1 V), the bandgap reference voltage (VBGR) should be less than 650 mV (e.g., 0.5V). Thus, the various embodiments of the differential op-amp circuit disclosed herein are described below as using a bandgap reference voltage (VBGR) of 0.5V. However, it should be understood that any other suitable bandgap reference voltage (VBGR) could, alternatively, be used.

The second reference voltage 205 can be, for example, a common mode voltage (VCMN). Those skilled in the art will recognize that a common mode voltage is a voltage from a current source with a mirror voltage. A current mirror is a type of circuit that outputs a weighted (ratioed) amount of current to one or more stages of transistors. In practice, the common mode voltage (VCMN) is the voltage applied to the gate of a first transistor (a reference transistor) in a current mirror and, particularly, of an NFET transistor in a diode configuration (i.e., the NFET is in the saturation region of operation) in the current mirror in order to provide a target reference current (Iref) through that first transistor. When this common mode voltage (VCMN) is also applied to the gate of a second transistor of the current mirror and, particularly, a second NFET, as discussed in greater detail below, the beta ratios of the first and second transistors determines the amount of output current (Iout) through the second transistor such that $I_{out}=(x/y)*Iref$, where x/y represents the beta ratio of the second transistor to the first transistor. This allows the amount of current in subsequent transistors to be readily controlled based on one reference current (Iref). Specifically, the current in the drain node of the second transistor will be the ratio of the current capacity of that drain node to the current capacity of the drain node (the reference node) of the first transistor (the reference transistor). In other words, as long as the first transistor and second transistor are well matched in terms of threshold voltage, channel length, channel width, etc., the reference current (Iref) should be equal to the output current (Iout). In any case, this common mode voltage (VCMN) 205, like the bandgap reference voltage (VBGR) 202, can be derived from the on-chip bandgap reference voltage circuit 290 and, thus, can be a process-voltage-temperature (PVT)-independent reference voltage. Additionally, the common mode voltage (VCMN) can be pre-selected based on the application (e.g., the voltage ranges, etc.), on the type of transistors used (e.g., threshold voltage type, oxide thickness type, etc.) and, most importantly, on the desired amount of current-controlled hysteresis, as discussed below. It should be understood that various different configurations for bandgap reference voltage circuits and current mirror circuits are well known in the art and, thus, the details of such circuits are omitted from this specification in order to allow the reader to focus on the salient aspects of the disclosed embodiments.

The op-amp 210 can further have a load stage 250. The load stage 250 can be a current mirror. The current mirror can have a first side with a pair of stacked transistors 251a-251b connected in series between a second voltage rail and the pair of stacked first transistors 261a-261b of the differential input stage 260 at a first output node 211. The current mirror can further have a second side with a pair of stacked transistors 252a-252b connected in series between the second voltage rail and the pair of stacked stacked second transistors 262a-262b of the differential input stage 260 at a second output node 212. The gates of the stacked transistors 251a-251b and 252a-252b in the current mirror can all be coupled to the first output node 211.

It should be noted that the stacked transistors 251a-251b and 252a-252b of the current mirror of the load stage should all have the same type conductivity and it should be different than that of the stacked transistors 261a-262b, 262a-263b and 263a-263b in the differential input stage 260. For example, as illustrated, the pair of stacked first transistors 261a-261b, the pair of stacked second transistors 262a-262b and the third transistor(s) 263a-263b of the differential input stage 260 can all be N-type field effect transistors (NFETs) with the source region of the first transistor 261b, the source region of the second transistor 262b and the drain region of the third transistor 263a being connected to each other at the node 215 and with the first voltage rail being ground. In this case, the pair of stacked transistors 251a-251b and the pair of stacked transistors 252a-252b of the current mirror can all be p-type field effect transistors (PFETs) with the drain region of the transistor 251b being connected to both the drain region of the first transistor 261a and the gates of the transistors 251a-b and 252a-b, with the drain region of the transistor 252b being connected to the drain of the second transistor 262a and the second output node 212 and with the second voltage rail being Vdd.

Each of the embodiments 200A-200E of the differential op-amp circuit can further incorporate an output buffer 220 coupled to the second output node 212 of the op-amp 210. The output buffer 220 can output a digital output signal 204 (OUT_BUFF) at a digital output node 226 based on an output voltage 203 at the second output node 212. Various different output buffer configurations are well known in the art and could be incorporated in the embodiments 200A-200E disclosed herein. However, for illustration purposes, the output buffer 220 can, as shown in FIGS. 2A-2E, include stacked PFETs 221a-221b, which are connected in series between Vdd and an intermediate node 225 and which have gates that are controlled by the output voltage 203 from the op-amp. The output buffer 220 can further include stacked NFETs 222a-222b, which are connected in series between ground and the intermediate node 225 and which have gates controlled by the second reference voltage 205. The output buffer 220 can further include another PFET 223 connected in series between Vdd and the digital output node 226 and another NFET 224 connected in series between ground and the digital output node 226. The gates of the PFET 223 and NFET 224 can be coupled to the intermediate node 225.

Those skilled in the art will recognize that, without hysteresis, a differential op-amp circuit with an op-amp 210 and an output buffer 220, configured as described above, would operate essentially as follows. When the input voltage 201 is below the reference voltage 202, the output voltage 203 at the second output node 212 would be pulled down and the digital output signal 204 would have a first value (e.g., a low value, a "0" value). Specifically, in the exemplary output buffer configuration provided, the PFETs 221a-221b would turn on such that the voltage level on the intermediate node 225 would be pulled up, turning off the PFET 223 and turning on the NFET 224, thereby pulling down the voltage level on the digital output node 226. However, when the input voltage 201 passes above the reference voltage 202, the output voltage 203 at the second output node 212 would be pulled up and the digital output signal 204 would have a second value (e.g., a high value, a "1" value). Specifically, in the exemplary output buffer configuration provided, the PFETs 221a-221b would turn off such that the voltage level on the intermediate node 225 would be pulled down, turning on the PFET 223 and turning off the NFET 224, thereby pulling up the voltage level on the digital output node 226. However, as mentioned above, small fluctuations due to noise could cause the digital output signal to repeatedly swing from low to high and vice versa (i.e., to chatter).

Thus, each of the embodiments 200A-200E of the differential op-amp circuit disclosed herein further incorporates one or more stable current sources to provide current-controlled hysteresis that is insensitive to PVT variations.

Figure 2A:
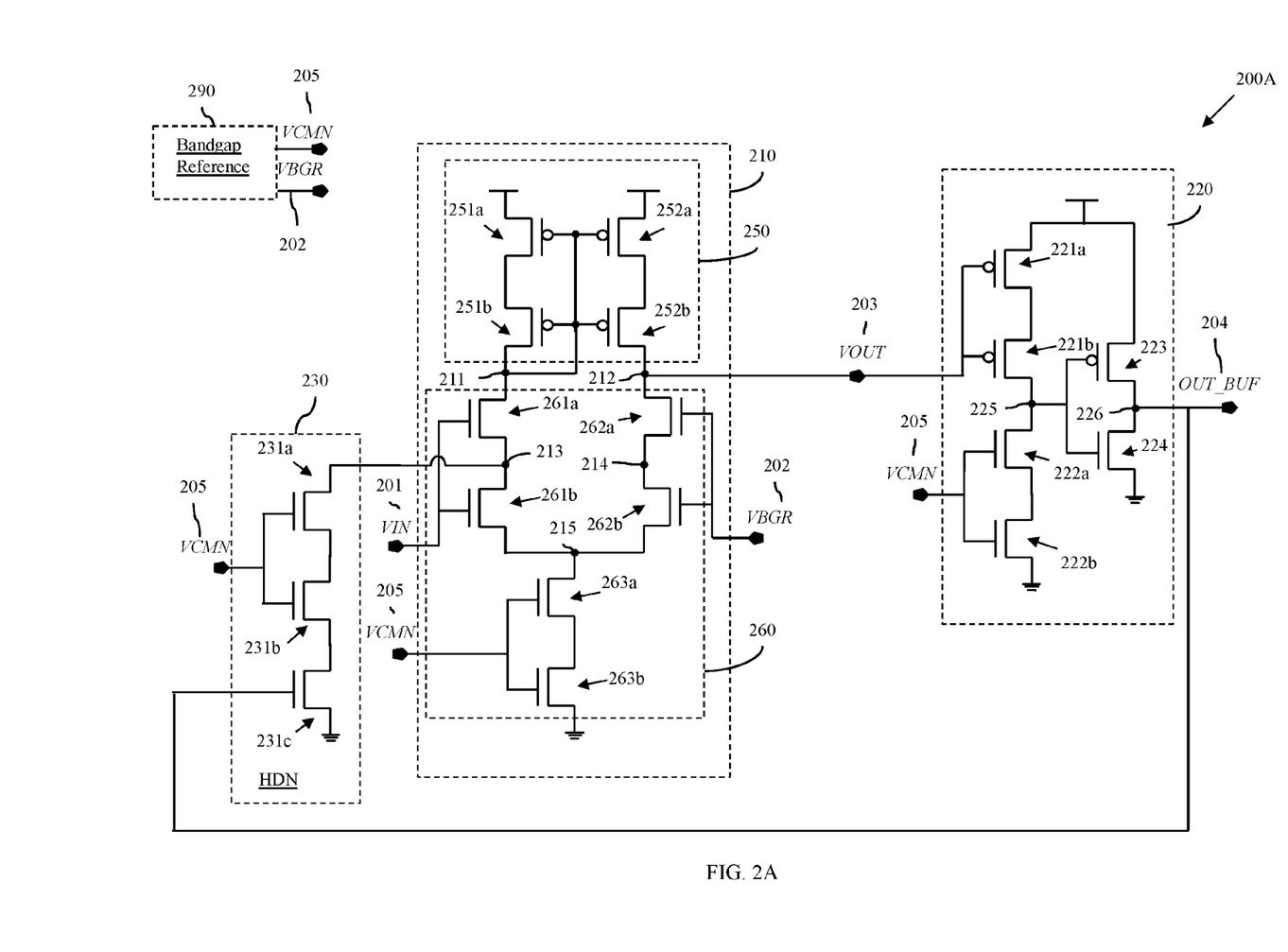
FIG. 2A is a schematic diagram illustrating an exemplary embodiment of the differential op-amp circuit, which provides a predetermined amount of current-controlled falling edge hysteresis.

For example, in the embodiment 200A of the differential op-amp circuit shown in FIG. 2A, a first current source 230 can be connected to the output buffer 220 and connected to the input voltage side of the op-amp 210 to provide a predetermined amount of current-controlled falling edge hysteresis. Specifically, the first current source 230 can include multiple stacked additional transistors 231a-231c. These additional transistors 231a-231c can be electrically connected in series between the node 213 (referred to in this embodiment 200A as the trip point adjustment node), which is at the interface between the stacked first transistors 261a-261b on the input voltage side of the differential input stage 260 of the op-amp 210, and the first voltage rail. For purposes of illustration, three additional transistors are shown. However, it should be understood that any number of two or more additional transistors could be used. In any case, the additional transistors 231a-231c will have the same type as the transistors in the differential input stage 260 of the op-amp 210. Thus, for example, the additional transistors 231a-231c can be NFETs connected in series between the trip point adjustment node 213 and ground. The gate of the most distal additional transistor from the trip point adjustment node 213 (e.g., the gate of the additional transistor 231c) can be controlled by the digital output signal 204, whereas the gates of all others of the additional transistors (e.g., the gates of the additional transistors 231a-231b) can be controlled by the second reference voltage 205 (i.e., the VCMN such that the first current source 230 can be referred to as a VCMN current source).

In operation, the first current source 230 will be selectively disabled and enabled, depending upon the value of the digital output signal 204. Specifically, when the input voltage 201 is below the reference voltage 202, the output voltage 203 on the second output node 212 of the op-amp will be relatively low such that the digital output signal 204 will have a first value (e.g., a low value, a "0" value) and the first current source 230 will be disabled because the most distal additional transistor 231c will be turned off. When the input voltage 201 rises above the reference voltage 202, the output voltage 203 on the second output node 212 of the op-amp will become relatively high such that the digital output signal 204 will switch to a second value (e.g., a high value, a "1" value). This switch causes the first current source 230 to be enabled because the most distal additional transistor 231c will be turn on. As a result, the voltage level at the trip point adjustment node 213 is pulled down by some predetermined amount and ensures that the digital output signal 204 will only be switched back to the first value (e.g., the low value, the "0" value) when the input voltage 201 has dropped below the reference voltage 202 by the predetermined amount. Thus, a small voltage drop due to noise alone would not cause the digital output signal to swing from high to low.

Figure 2B:
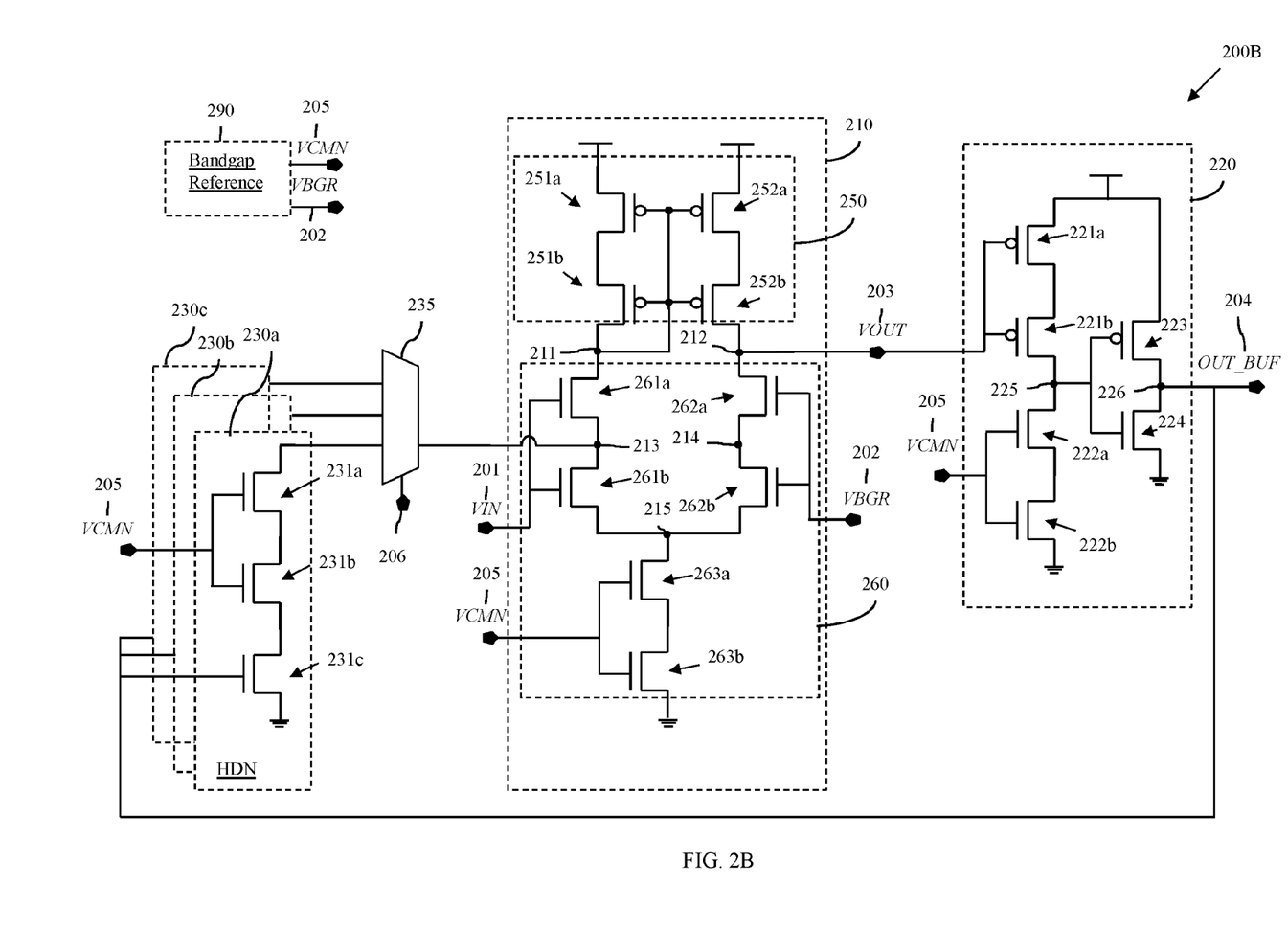
FIG. 2B is a schematic diagram illustrating another exemplary embodiment of the differential op-amp circuit, which provides a selectable predetermined amount of current-controlled falling edge hysteresis.

The embodiment 200B of the differential op-amp circuit shown in FIG. 2B is similar to the embodiment 200A shown in FIG. 2A, described above, in that it provides current-controlled falling edge hysteresis. However, instead of being connected directly to a single first current source 230 to allow for voltage reduction at the trip point adjustment node 213 by a set voltage amount, the trip point adjustment node 213 can be connected to a multiplexer 235, which is, in turn, connected to a set of multiple different first current sources 230a-230c with different numbers and/or sizes of additional transistors to allow the voltage level at the trip point adjustment node 213 to be selectively reduced by different amounts. For purposes illustration, three different first current sources are shown. However, it should be understood that this embodiment 200B could incorporate any number of two or more different first current sources. In this case, the multiplexer 235 can receive a select signal 206 from a user and, based on the select signal, can selectively connect a specific first current source (e.g., 230a, 230b, or 230c) to the trip point adjustment node 213 so as to allow the voltage level at the trip point adjustment node 213 to be adjusted and, particularly, pulled down by a selected predetermined amount when the digital output signal 204 has the second value (e.g., the high value, the "1" value), thereby enabling the specific first current source selected.

Figure 2C:
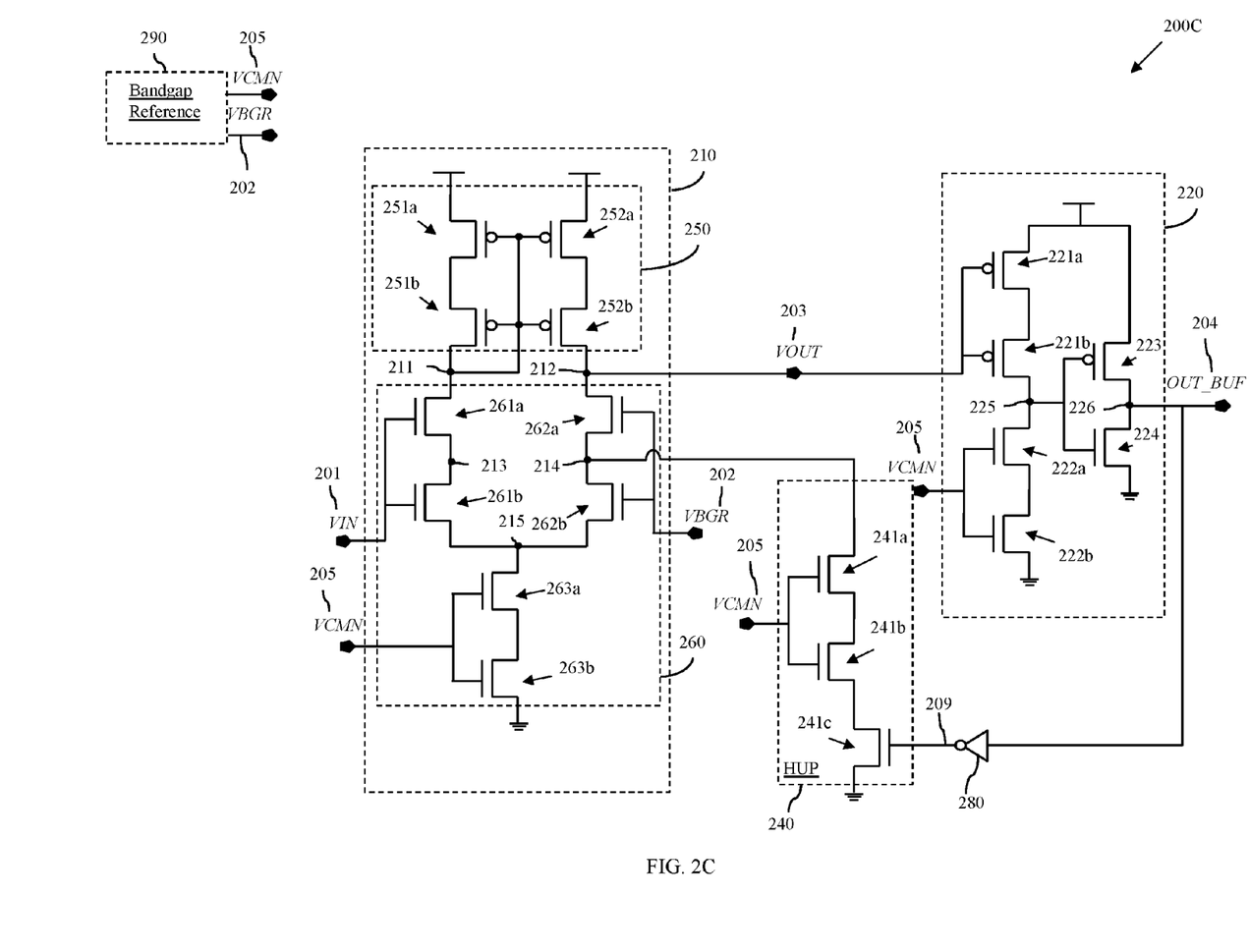
FIG. 2C is a schematic diagram illustrating yet another exemplary embodiment of the differential op-amp circuit, which provides a predetermined amount of current-controlled rising edge hysteresis.

In the embodiment 200C of the differential op-amp circuit shown in FIG. 2C, a second current source 240 can be connected through an inverter 280 to the output buffer 220 and further connected to the reference voltage side of the op-amp 210 to provide a predetermined amount of current-controlled rising edge hysteresis. Specifically, the inverter 280 can be electrically connected to the digital output node 226 of the output buffer 220, can receive the digital output signal 204 and output an inverted digital output signal 209. The inverter 280 can further be connected to a second current source 240. This second current source 240 can include multiple stacked additional transistors 241a-241c. These additional transistors 241a-241c can be electrically connected in series between the node 214 (referred to in this embodiment 200C as the trip point adjustment node), which is at the interface between the stacked second transistors 262a-262b on the reference voltage side of the differential input stage 260 of the op-amp 210, and the first voltage rail. For purposes of illustration, three additional transistors are shown. However, it should be understood that any number of two or more additional transistors could be used. In any case, the additional transistors 241a-241c will have the same type as the transistors in the differential input stage 260 of the op-amp 210. Thus, for example, the additional transistors 241a-241c can be NFETs connected in series between the trip point adjustment node 214 and ground. The gate of the most distal additional transistor from the trip point adjustment node 214 (e.g., the gate of the additional transistor 241c) can be controlled by the inverted digital output signal 209, whereas the gates of all others of the additional transistors (e.g., the gates of the additional transistors 241a-241b) can be controlled by the second reference voltage 205 (i.e., the VCMN such that the first current source 230 can be referred to as a VCMN current source).

In operation, the second current source 240 will be selectively disabled and enabled, depending upon the value of the digital output signal 204 and, more particularly, on the value of the inverted digital output signal 209, which is dependent upon the value of the digital output signal 204. Specifically, when the input voltage 201 is above the reference voltage 202, the output voltage 203 on the second output node 212 of the op-amp will be relatively high such that the digital output signal 204 will have the second value (e.g., the high value, the "1" value), the inverted digital output signal 209 will have the first value (e.g., the low value, the "0" value) and the the second current source 240 will be disabled because the most distal additional transistor 241c will be turned off. When the input voltage 201 falls below the reference voltage 202, the output voltage 203 on the second output node 212 of the op-amp will become relatively low such that the digital output signal 204 will switch to the first value (e.g., the low value, the "0" value) and the inverted digital output signal 209 will switch to the second value (e.g., the high value, the "1" value). This switch of the inverted digital output signal 209 from low to high causes the second current source 240 to be enabled because the most distal additional transistor 241c will be turned on. As a result, the voltage level at the trip point adjustment node 214 is pulled down by some predetermined amount and ensures that the digital output signal 204 will only be switched back to the second value (e.g., the high value, the "1" value) and the inverted digital output signal 209 will only be switched back to the first value (e.g., the low value, the "0" value) when the input voltage 201 has risen above the reference voltage 202 by the predetermined amount. Thus, a small voltage increase due to noise alone would not cause the digital output signal to swing from low to high.

Figure 2D:
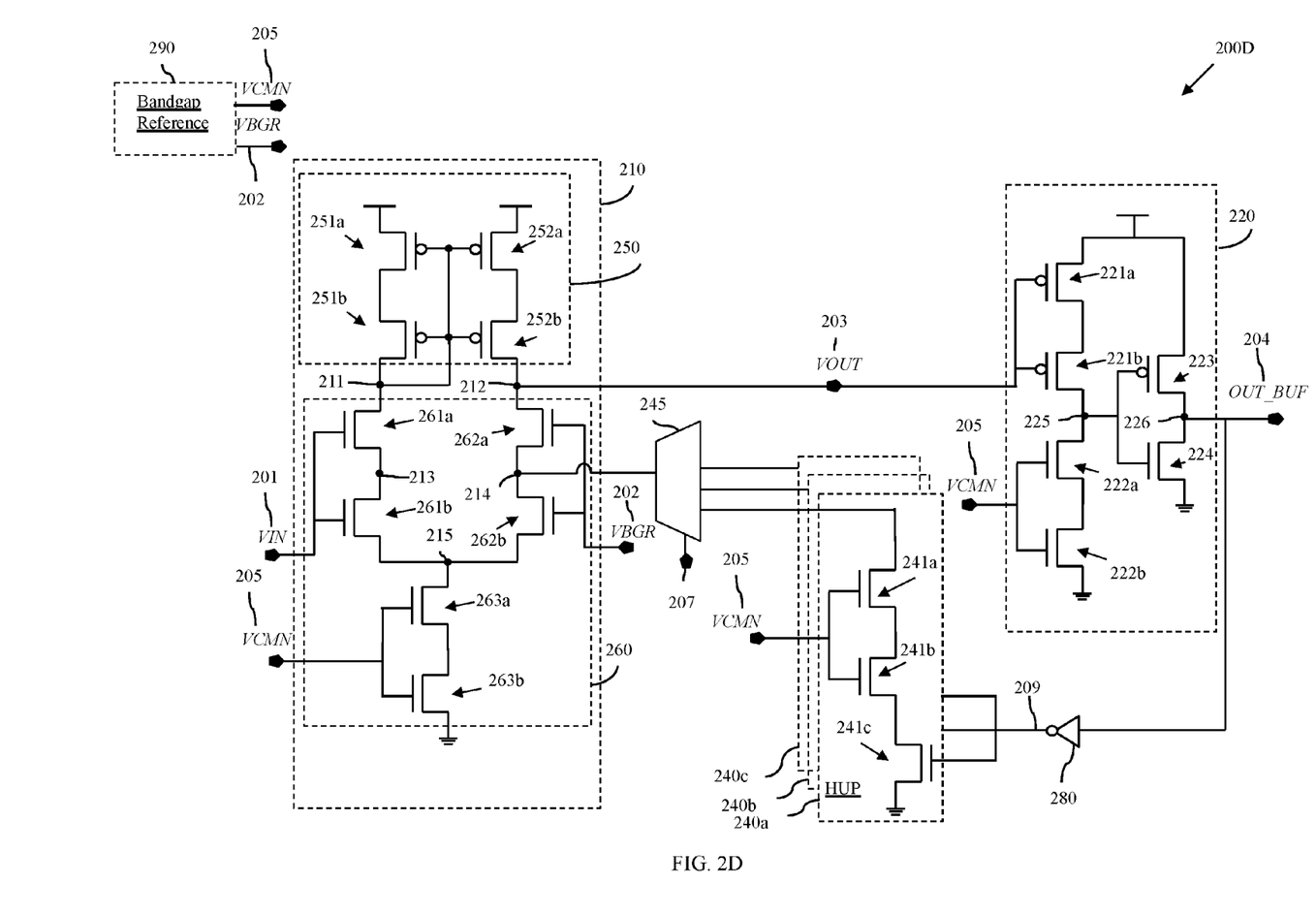
FIG. 2D is a schematic diagram illustrating yet another exemplary embodiment of the differential op-amp circuit, which provides a selectable predetermined amount of current-controlled rising edge hysteresis.

The embodiment 200D of the differential op-amp circuit shown in FIG. 2D is similar to the embodiment 200C shown in FIG. 2C, described above, in that it provides current-controlled rising edge hysteresis. However, instead of being connected directly to a single current source 240 to allow for voltage adjustment at the trip point adjustment node by set voltage amount, the trip point adjustment node 214 can be connected to a multiplexer 245, which is, in turn, connected to a set of multiple different second current sources 240a-240c with different numbers and/or sizes of additional transistors. The output buffer 220 can be connected to each of the second current sources 240a-240c through the inverter 280 (or corresponding inverters, not shown). For illustration purposes, three different second current sources are shown. However, it should be understood that this embodiment 200D could incorporate any number of two or more different second current sources. In this case, the multiplexer 245 can receive a select signal 207 from a user and, based on the select signal, can selectively connect a specific second current source (e.g., 240a, 240b, or 240c) to the trip point adjustment node 214 so as to allow the voltage level at the trip point adjustment node 214 to be adjusted and, particularly, pulled down by a selected predetermined amount when the digital output signal 204 has the first value (e.g., the low value, the "0" value) and the inverted digital output signal 209 has the second value (e.g., the high value, the "1" value), thereby enabling the specific second current source selected.

Figure 2E:
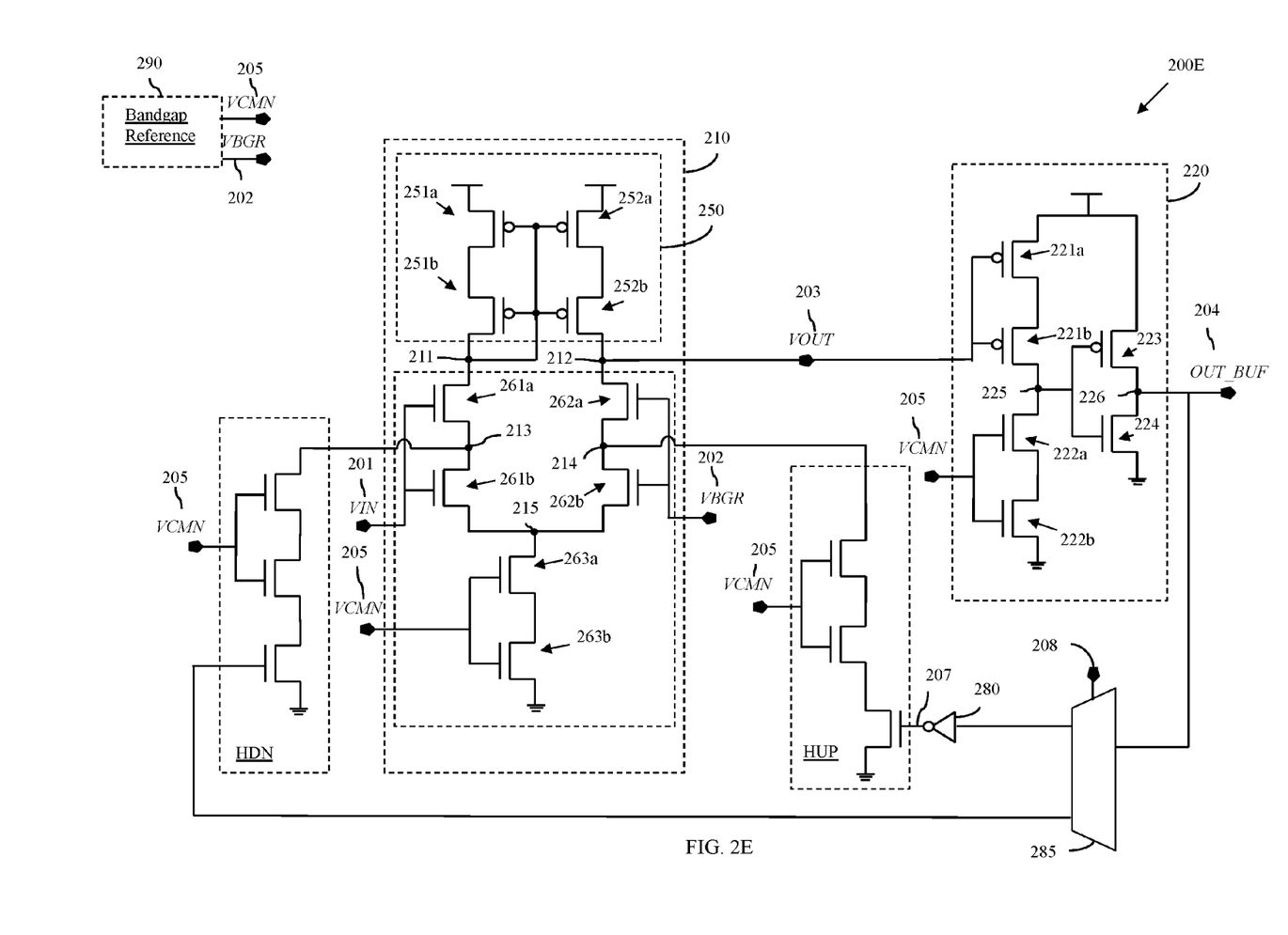
FIG. 2E is a schematic diagram illustrating yet another exemplary embodiment of the differential op-amp circuit, which provides a selectable predetermined amount of either current-controlled falling edge hysteresis or current-controlled rising edge hysteresis.

In the embodiment 200E of the differential op-amp circuit shown in FIG. 2E, the features of the embodiment described above can be combined to provide selectable current-controlled falling edge hysteresis and current-controlled rising edge hysteresis. That is, one or more first current source(s) 230 can be connected to the node 213 (referred to in this embodiment 200E as the first trip point adjustment node) on the input voltage side of the op-amp 210, as shown in either the embodiment 200A of FIG. 2A or the embodiment 200B of FIG. 2B. Additionally, one or more second current source(s) 240 can be connected to the node 214 (referred to in this embodiment 200E as the second trip point adjustment node) on the reference voltage side of the op-amp 210, as shown in either the embodiment 200C of FIG. 2C or the embodiment 200D of FIG. 2D). In this case, a multiplexer 285 can be electrically connected to the digital output node 226. The multiplexer 285 can receive a select signal 208 from a user and, based on the select signal, can selectively connect the output buffer 220 to either the first current source 230 for providing falling edge hysteresis or the inverter 280 for providing rising edge hysteresis. Specifically, if the select signal 208 received by the multiplexer 285 has a value indicating that the user desires falling edge hysteresis, the multiplexer 285 will selectively connect the output buffer 220 to the first current source 230. In this case, the first current source 230 will receive the digital output signal 204. As discussed in detail above with regard to the embodiment 200A of FIG. 2A, the first current source 230 will be selectively disabled when the digital output signal 204 has the first value (e.g., the low value, the "0" value) and selectively enabled to provide falling edge hysteresis when the digital output signal 204 has the second value (e.g., the high value, the "1" value). However, if the select signal 208 received by the multiplexer 285 has a value indicating that the user desires rising edge hysteresis, the multiplexer 285 will selectively connect the output buffer 220 to the inverter 280. In this case, the inverter 280 will receive the digital output signal 204. As discussed in detail above with regard to the embodiment 200C of FIG. 2C, the inverter 280 will invert the digital output signal 204 and output an inverted digital output signal 209 to the second current source 240. The second current source 240 will be disabled when the inverted digital output signal 209 has the first value (e.g., the low value, the "0" value) and selectively enabled to provide rising edge hysteresis when the inverted digital output signal 209 has the second value (e.g., the high value, the "1" value).

Those skilled in the art will recognize that the desired amount of hysteresis for the op-amp 210 in any of the embodiments 200A-200E of the differential op-amp circuit described above can be determined based on the expected voltage fluctuation that will be present due to noise. The amount of hysteresis achieved can be tailored during design by adjusting the numbers and sizes of the additional transistors in the current source and/or by adjusting the voltage level of the VCMN used. The amount of hysteresis can further be tailored on demand, as in the embodiments 200B and 200D through selection, via a multiplexer, of differently configured current sources. Additionally, the configurations of the various embodiments 200A-200E of the differential op-amp circuit disclosed herein have the advantage of providing hysteresis that is essentially constant and quite insensitive to PVT variations. Specifically, since, as discussed above, the current source(s), which provide the falling edge hysteresis and/or the rising edge hysteresis in each of the embodiments 200A-200E described above, are VCMN current sources (i.e., they have gates controlled by the VCMN) and since the VCMN is a reference voltage provided by the bandgap reference circuit 290 such that it is temperature-independent as well as independent of device threshold voltage (Vth) variations, the current level(s) provided by the current source(s) will be essentially stable. Thus, only minimal variations will be seen in the amount of hysteresis provided by the current source(s) over the operational temperature range (e.g., −25 C to 125 C) and supply voltage range (e.g., 0.7V to 1.0V) for the circuit across each of the three process corners including NMOS slow/PMOS slow (SS), NMOS typical/PMOS typical, and NMOS fast/PMOS fast (FF)).

Figure 3:
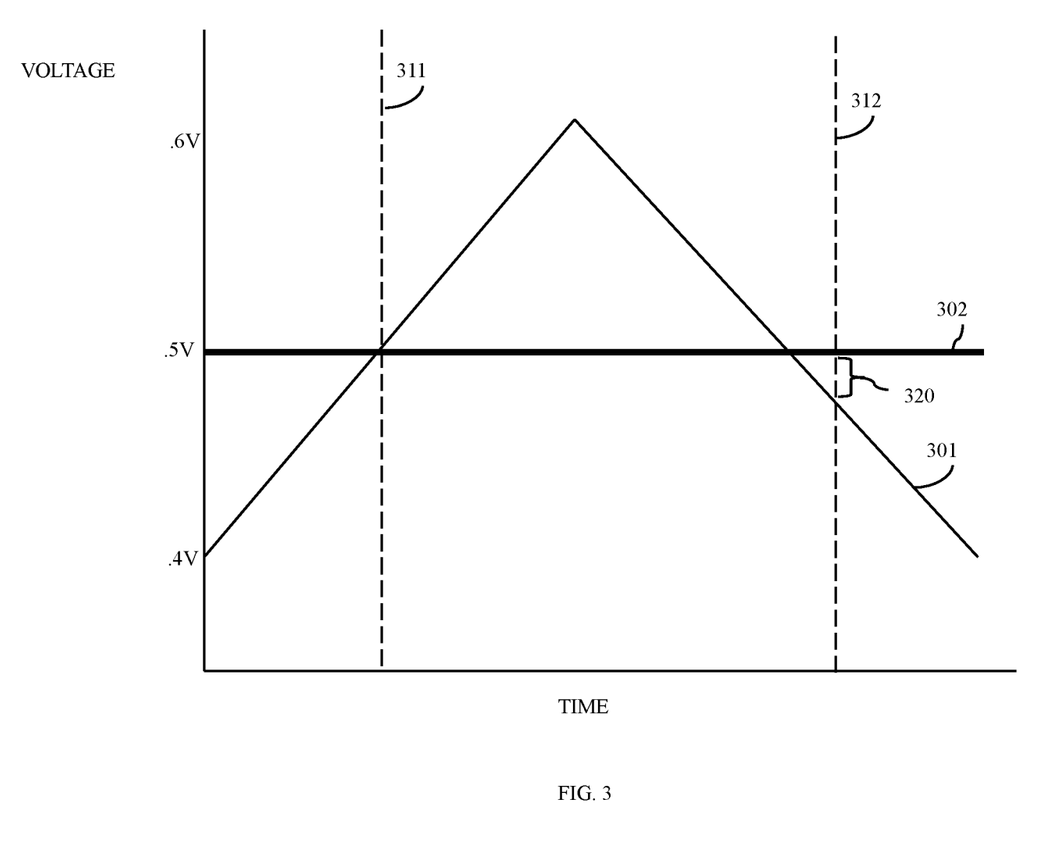
FIG. 3 is a graph illustrating exemplary falling edge hysteresis provided by the embodiment of the differential op-amp circuit of FIG. 2A.

For example, FIG. 3 is a graph illustrating exemplary falling edge hysteresis provided by the embodiment 200A of the differential op-amp circuit of FIG. 2A. This graph shows a curve 301 representing changes in the input voltage 201 over a given time period and a horizontal line 302 representing the constant state of the reference voltage 202 over the same time period. For purposes of illustration, the reference voltage is shown as being 0.5V. As illustrated, during this time period, the input voltage represented by curve 301 begins below the reference voltage, rises above the reference voltage, and subsequently falls back down below the reference voltage. This graph further shows vertical lines 311 and 312 indicating the points in time when the digital output signal 204 switches from low to high and from high to low, respectively. Since in this embodiment 200A, rising edge hysteresis is not provided, the vertical line 311 illustrates that the point at which the digital output signal 204 switches from low to high is static and is when the input voltage rises above the reference voltage (e.g., above 0.5V). However, since in this embodiment 200A, falling edge hysteresis is provided, the vertical line 312 illustrates that the point at which the digital output signal 204 switches from high to low is dynamic and is some time after the input voltage has fallen below the reference voltage and, particularly, when the input voltage has fallen some predetermined amount 320 below the reference voltage. This predetermined amount 320 can, for example, be 15 mV and may vary only slightly (e.g., by ±5 mV) over the operational temperature range and supply voltage range for the circuit across the process corners SS, TT and FF.

Figure 4:
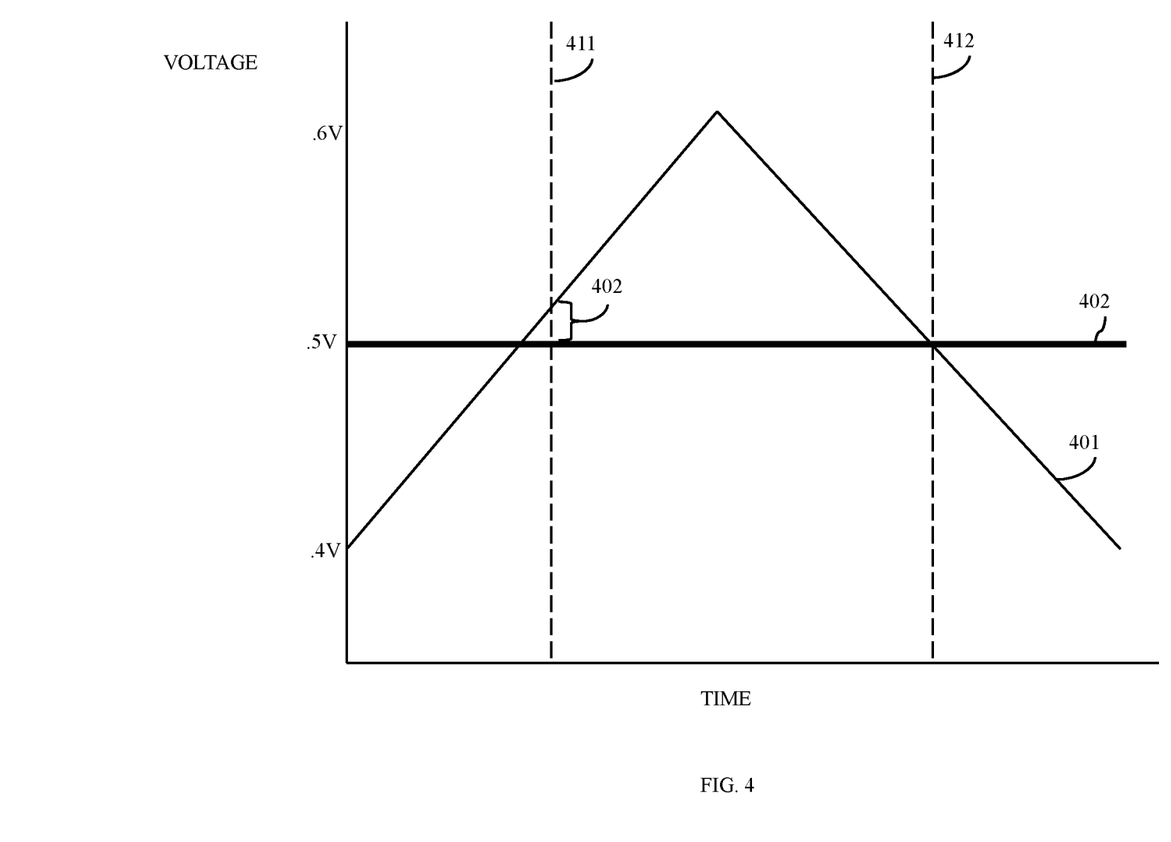
FIG. 4 is a graph illustrating exemplary rising edge hysteresis provided by the embodiment of the differential op-amp circuit of FIG. 2C.

FIG. 4 is a graph illustrating exemplary rising edge hysteresis provided by the embodiment 200C of the differential op-amp circuit of FIG. 2C. This graph shows a curve 401 representing changes in the input voltage 201 over a given time period and a horizontal line 402 representing the constant state of the reference voltage 202 over the same time period. For purposes of illustration, the reference voltage is shown as being 0.5V. As illustrated, during this time period, the input voltage represented by curve 401 begins below the reference voltage, rises above the reference voltage, and subsequently falls back down below the reference voltage. This graph further shows vertical lines 411 and 412 indicating the points in time when the digital output signal 204 switches from low to high and from high to low, respectively. Since in this embodiment 200C, falling edge hysteresis is not provided, the vertical line 412 illustrates that the point at which the digital output signal 204 switches from high to low is static and is when the input voltage falls below the reference voltage (e.g., below 5V). However, since in this embodiment 200C, rising edge hysteresis is provided, the vertical line 411 illustrates that the point at which the digital output signal 204 switches from low to high is dynamic and is some time after the input voltage has risen above the reference voltage and, particularly, when the input voltage has risen some predetermined amount 420 above the reference voltage. This predetermined amount 420 can, for example, be 15 mV and may vary only slightly (e.g., by ±5 mV) over the operational temperature range and supply voltage range for the circuit across the process corners SS, TT and FF.

It should be understood that the terminology used herein is for the purpose of describing the disclosed circuits and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are various embodiments of a differential operational amplifier (op-amp) circuit with current-controlled hysteresis. Each of the embodiments disclosed herein can incorporate an operational amplifier (op-amp) and an output buffer. The output buffer can be electrically connected to an output node of the op-amp and can output a digital output signal indicating whether or not an input voltage applied to one side of the op-amp is higher or lower than a reference voltage applied to another side of the op-amp. The circuit can further incorporate at least one first current source for providing falling edge hysteresis to a node between stacked FETs on the input voltage side of the op-amp based on the value of the digital output signal and/or at least one second current source for providing rising edge hysteresis to a node between stacked FETs on the reference voltage side of the op-amp based on the value of the digital output signal inverted. These current source(s) can further be controlled by a reference voltage from a bandgap reference circuit, thereby ensuring the amount of hysteresis provided is essentially stable (i.e., insensitive to process-voltage-temperature (PVT) variations).

What is claimed is:

1. A circuit structure comprising:
   an operational amplifier comprising:
   a pair of stacked first transistors;
   an output node;
   a pair of stacked second transistors connected in series to the output node;
   at least one third transistor, the pair of stacked first transistors and the pair of stacked second transistors being connected to the third transistor; and,
   a trip point adjustment node between the stacked first transistors;
   a current source electrically connected to the trip point adjustment node; and
   an output buffer electrically connected between the output node and the current source, the output buffer outputting a digital output signal based on an output voltage at the output node and the current source being selectively disabled when the digital output signal has a first value and selectively enabled to adjust a voltage level at the trip point adjustment node by a predetermined amount when the digital output signal has a second value to provide falling edge hysteresis.

2. The circuit structure of claim 1,
   the current source comprising at least two stacked additional transistors electrically connected in series between the trip point adjustment node and ground,
   the stacked first transistors, the stacked second transistors, the third transistor and the stacked additional transistors comprising N-type field effect transistors, and
   the output buffer applying the digital output signal to a gate of a most distal of the stacked additional transistors from the trip point adjustment node.

3. The circuit structure of claim 2,
   the output voltage varying depending upon a difference between an input voltage applied to first gates of the stacked first transistors and a reference voltage applied to second gates of the stacked second transistors,
   when the input voltage is above the reference voltage, the output voltage is relatively high such that the digital output signal has a high value and the current source is enabled, pulling down the voltage level on the trip point adjustment node by the predetermined amount to provide falling edge hysteresis, ensuring that the digital output signal will only be switched to a low value when the input voltage has dropped below the reference voltage by the predetermined amount, and
   when the input voltage has dropped below the reference voltage by the predetermined amount, the output voltage is relatively low such that digital output signal switches to the low value and the current source is disabled, allowing the digital output signal to be switch back to the high value only when the input voltage has risen above the reference voltage.

4. The circuit structure of claim 3, the reference voltage being a bandgap reference voltage from a bandgap reference voltage circuit and a gate of the third transistor being controlled by a common mode voltage from the bandgap reference voltage circuit.

5. The circuit structure of claim 2, the predetermined amount being dependent upon sizes of the stacked additional transistors.

6. The circuit structure of claim 1, further comprising a multiplexer connected to the trip point adjustment node and a set of different current sources, the set of different current sources includes the current source, the multiplexer receiving a select signal and, based on the select signal, selectively connecting one specific current source of the set of different current sources to the trip point adjustment node so as to allow the voltage level at the trip point adjustment node to be adjusted by a selected predetermined amount.

7. The circuit structure of claim 1, the operational amplifier further comprising a current mirror, the pair of stacked first transistors and the pair of stacked second transistors being electrically connected to different sides of the current mirror.

8. A circuit structure comprising:
an operational amplifier comprising:
a pair of stacked first transistors;
an output node;
a pair of stacked second transistors connected in series to the output node;
at least one third transistor, the pair of stacked first transistors and the pair of stacked second transistors being connected to the third transistor; and,
a trip point adjustment node between the stacked second transistors;
a current source electrically connected to the trip point adjustment node; and
the output buffer outputting a digital output signal based on an output voltage at the output node and the current source being selectively enabled to adjust a voltage level at the trip point adjustment node by a predetermined amount when the digital output signal has a first value and being selectively disabled when the digital output signal has a second value.

9. The circuit structure of claim 8,
the current source comprising at least two stacked additional transistors electrically connected in series between the trip point adjustment node and ground,
the stacked first transistors, the stacked second transistors, the third transistor and the stacked additional transistors comprising N-type field effect transistors, and
the circuit structure further comprising an inverter receiving the digital output signal from the output buffer, converting the digital output signal into an inverted digital output signal and applying the inverted digital output signal to a gate of a most distal of the stacked additional transistors from the trip point adjustment node.

10. The circuit structure of claim 9,
the output voltage varying depending upon a difference between an input voltage applied to first gates of the stacked first transistors and a reference voltage applied to second gates of the stacked second transistors,
when the input voltage is below the reference voltage, the output voltage is relatively low such that the digital output signal has a low value, the inverted digital output signal has a high value and the current source is enabled, pulling down the voltage level on the trip point adjustment node by the predetermined amount to provide rising edge hysteresis, ensuring that the digital output signal will only be switched to the high value when the input voltage has risen above the reference voltage by the predetermined amount, and
when the input voltage has risen above the reference voltage by the predetermined amount, the output voltage is relatively high such that digital output signal switches to the high value, the inverted digital output signal switches to the low value and the current source is disabled, allowing the digital output signal to be switch back to the low value only when the input voltage has fallen below the reference voltage.

11. The circuit structure of claim 10, the reference voltage being a bandgap reference voltage from a bandgap reference voltage circuit and a gate of the third transistor being controlled by a common mode voltage from the bandgap reference voltage circuit.

12. The circuit structure of claim 9, the predetermined amount being dependent upon sizes of the stacked additional transistors.

13. The circuit structure of claim 8, further comprising a multiplexer connected to the trip point adjustment node and a set of different current sources, the set of different current sources includes the current source, the multiplexer receiving a select signal and, based on the select signal, selectively connecting one specific current source of the set of different current sources to the trip point adjustment node so as to allow the voltage level at the trip point adjustment node to be adjusted by a selected predetermined amount.

14. The circuit structure of claim 8, the operational amplifier further comprising a current mirror, the pair of stacked first transistors and the pair of stacked second transistors being electrically connected to different sides of the current mirror.

15. A circuit structure comprising:
an operational amplifier comprising:
a pair of stacked first transistors;
an output node;
a pair of stacked second transistors connected in series to the output node;
at least one third transistor, the pair of stacked first transistors and the pair of stacked second transistors being connected to the third transistor;
a first trip point adjustment node between the stacked stacked first transistors; and
a second trip point adjustment node between the stacked second transistors;
an output buffer electrically connected to the output node and outputting a digital output signal based on an output voltage at the output node;
a multiplexer receiving the digital output signal from the output buffer;
a first current source electrically connected to the first trip point adjustment node;
a second current source electrically connected to the second trip point adjustment node; and,
an inverter electrically connected to the second current source,
the multiplexer, in response to a select signal, selectively connecting the output buffer to one of the first current source for providing falling edge hysteresis and the inverter for providing rising edge hysteresis.

16. The circuit structure of claim 15, the first current source receiving the digital output signal and being selectively disabled when the digital output signal has a low value and selectively enabled to pull-down a first voltage level at the first trip point adjustment node by a first predetermined amount when the digital output signal has a high value to provide falling edge hysteresis.

17. The circuit structure of claim 15, the inverter receiving the digital output signal, inverting the digital output signal and outputting an inverted digital output signal to the second current source, the second current source being selectively enabled to reduce a reference voltage level at the second trip point adjustment node by a second predetermined amount when the digital output signal has a low value to provide rising edge hysteresis and being selectively disabled when the digital output signal has a high value.

18. The circuit structure of claim 15, the operational amplifier further comprising a current mirror, the pair of stacked first transistors and the pair of stacked second transistors being electrically connected to different sides of the current mirror.

19. The circuit structure of claim 15, the output voltage varying depending upon a difference between an input voltage applied to first gates of the stacked first transistors and a reference voltage applied to second gates of the stacked second transistors.

20. The circuit structure of claim 19, the reference voltage being a bandgap reference voltage from a bandgap reference voltage circuit.

* * * * *